(12) United States Patent
Murase et al.

(10) Patent No.: US 10,732,229 B2
(45) Date of Patent: Aug. 4, 2020

(54) BATTERY PACK

(75) Inventors: Hiroaki Murase, Tokyo (JP); Kazuhiro Muto, Chiba (JP)

(73) Assignees: ITOCHU Corporation, Osaka (JP); The Japan Research Institute, Limited, Tokyo (JP)

( * ) Notice: Subject to any disclaimer, the term of this patent is extended or adjusted under 35 U.S.C. 154(b) by 496 days.

(21) Appl. No.: 13/239,398

(22) Filed: Sep. 22, 2011

(65) Prior Publication Data

US 2012/0015221 A1 Jan. 19, 2012

Related U.S. Application Data

(63) Continuation of application No. PCT/JP2010/002106, filed on Mar. 25, 2010.

(30) Foreign Application Priority Data

Mar. 27, 2009 (JP) .................. 2009-080617

(51) Int. Cl.
  *G01R 31/396* (2019.01)
  *H01M 10/04* (2006.01)
  *G01R 31/392* (2019.01)

(52) U.S. Cl.
  CPC ...... *G01R 31/396* (2019.01); *H01M 10/0404* (2013.01); *G01R 31/392* (2019.01)

(58) Field of Classification Search
  CPC ..... H01M 10/4257; H01M 2010/4278; H01M 10/425; H01M 10/48; H01M 10/482; H01M 10/486; H01M 10/0404; B60L 11/1857; B60L 11/1864; B60L 2240/545; G01R 31/3658; G01R 31/396; G01R 31/392; Y02T 10/7005; Y02T 10/7061

USPC ............................................. 429/91
See application file for complete search history.

(56) References Cited

U.S. PATENT DOCUMENTS

| | | | | |
|---|---|---|---|---|
| 5,955,865 | A | * | 9/1999 | Koike ............... B60K 6/28 320/104 |
| 2003/0076072 | A1 | * | 4/2003 | Tojo .............. G01R 31/3648 320/134 |
| 2004/0241541 | A1 | * | 12/2004 | Watanabe et al. ........... 429/163 |
| 2007/0108946 | A1 | | 5/2007 | Yamauchi et al. |
| 2007/0134546 | A1 | | 6/2007 | Hashimoto |
| 2009/0011327 | A1 | | 1/2009 | Okumura et al. |
| 2009/0013521 | A1 | | 1/2009 | Okumura et al. |

(Continued)

FOREIGN PATENT DOCUMENTS

| | | | |
|---|---|---|---|
| EP | 1786057 | * | 5/2007 |
| JP | 2727149 B2 | | 4/1994 |

(Continued)

OTHER PUBLICATIONS

Machine Translation of JP 2003-017138.*

(Continued)

*Primary Examiner* — Stephen J Yanchuk

(57) ABSTRACT

Provided is a battery pack comprising a plurality of batteries; and a plurality of memories that correspond respectively to the batteries and that each record deterioration information of the corresponding battery. Each set of a battery and a corresponding memory may be formed integrally as a battery cell. As a result, the deterioration information of each battery cell can be known even after the battery pack is disassembled.

7 Claims, 10 Drawing Sheets

(56) References Cited

U.S. PATENT DOCUMENTS

2009/0140870 A1* 6/2009 Densham ................. 340/636.15
2009/0145674 A1* 6/2009 Lee et al. ..................... 180/65.1
2011/0234232 A1* 9/2011 Ro .......................... B07C 5/344
324/433

FOREIGN PATENT DOCUMENTS

JP          2003-17138 A     1/2003
WO    WO-2008-117732      * 10/2008

OTHER PUBLICATIONS

Office Action issued for related U.S. Appl. No. 14/791,271, issued by the United States Patent and Trademark Office dated Feb. 9, 2017.
Office Action issued for counterpart U.S. Appl. No. 14/791,271, issued by the USPTO dated Sep. 12, 2017.
Office Action issued for U.S. Appl. No. 13/239,391, issued by the USPTO dated Apr. 20, 2012.
Office Action issued for U.S. Appl. No. 13/239,391, issued by the USPTO dated Mar. 21, 2013.
Office Action issued for U.S. Appl. No. 13/239,391, issued by the USPTO dated Jan. 27, 2014.
Office Action issued for U.S. Appl. No. 13/239,391, issued by the USPTO dated Jul. 29, 2014.
Office Action issued for related U.S. Appl. No. 14/791,271, issued by the USPTO dated Jan. 25, 2018.

* cited by examiner

| TIME | EQUIPMENT | DRIVING ENVIRONMENT |
|---|---|---|
| 2009/2/20 7:30 | AIR CONDITIONER | 25 DEGREES |
| | DEFOGGER | ON |
| | SEAT WARMER | STRONG |
| 2009/2/20 20:00 | AIR CONDITIONER | 27 DEGREES |
| | DEFOGGER | ON |
| | SEAT WARMER | MEDIUM |
| 2009/2/21 13:00 | AIR CONDITIONER | 26 DEGREES |
| | DEFOGGER | OFF |
| | SEAT WARMER | OFF |
| . . | . . | . . |

FIG. 6

BATTERY PACK

The contents of the following International patent application are incorporated herein by reference: International Patent Application No. PCT/JP2010/002106 filed on Mar. 25, 2010.

BACKGROUND

1. Technical Field

The present invention relates to a battery pack having a memory.

2. Related Art

A conventional battery pack is known that includes a plurality of battery cells and a memory in which is recorded deterioration information for each battery cell, as shown in Japanese Patent Application Publication No. 2003-17138, for example.

Since the memory is disposed in the battery pack, after the battery pack is separated into the battery cells, the deterioration information recorded in the memory cannot be correctly associated with each corresponding battery cell.

SUMMARY

According to a first aspect related to the innovations herein, provided is a battery pack comprising a plurality of batteries; and a plurality of memories that correspond respectively to the batteries and that each record deterioration information of the corresponding battery.

Each set of a battery and a corresponding memory may be formed integrally as a battery cell.

Each battery may be formed by a pair of electrodes, each battery cell may include an exterior portion that shields the electrodes from the outside, and each memory may be disposed within the corresponding exterior portion.

Each battery cell may further include a detecting section that detects at least one of current and voltage of the corresponding battery, and each memory may record the deterioration information based on at least one of the detected current and the detected voltage.

Each battery cell may further include a deterioration information calculating section that calculates the deterioration information based on at least one of the detected current and the detected voltage.

Each battery cell may further include an output interface that outputs the deterioration information from the memory to the outside of the battery cell.

The battery pack may further comprise a detecting section that detects at least one of current and voltage of each battery, and each memory may record the deterioration information based on at least one of the detected current and the detected voltage of the corresponding battery.

The battery pack may further comprise a deterioration information calculating section that calculates the deterioration information of each battery, based on at least one of the detected current and the detected voltage of each battery.

Each battery cell may further include an input/output interface for inputting deterioration information from outside the battery cell into the corresponding memory and for outputting the deterioration information from the corresponding memory to the outside of the battery cell.

Each memory may record, as the deterioration information, at least one of the number of times the corresponding battery is charged and discharged, voltage history of the corresponding battery, current history of the corresponding battery, charge-start voltage of the corresponding battery, charge-end voltage of the corresponding battery, an internal resistance value of the corresponding battery, and temperature of the corresponding battery.

The summary clause does not necessarily describe all necessary features of the embodiments of the present invention. The present invention may also be a sub-combination of the features described above.

BRIEF DESCRIPTION OF THE DRAWINGS

FIG. 6 shows an exemplary driving environment table 214.

DESCRIPTION OF EXEMPLARY EMBODIMENTS

Hereinafter, some embodiments of the present invention will be described. The embodiments do not limit the invention according to the claims, and all the combinations of the features described in the embodiments are not necessarily essential to means provided by aspects of the invention.

Figure 1:
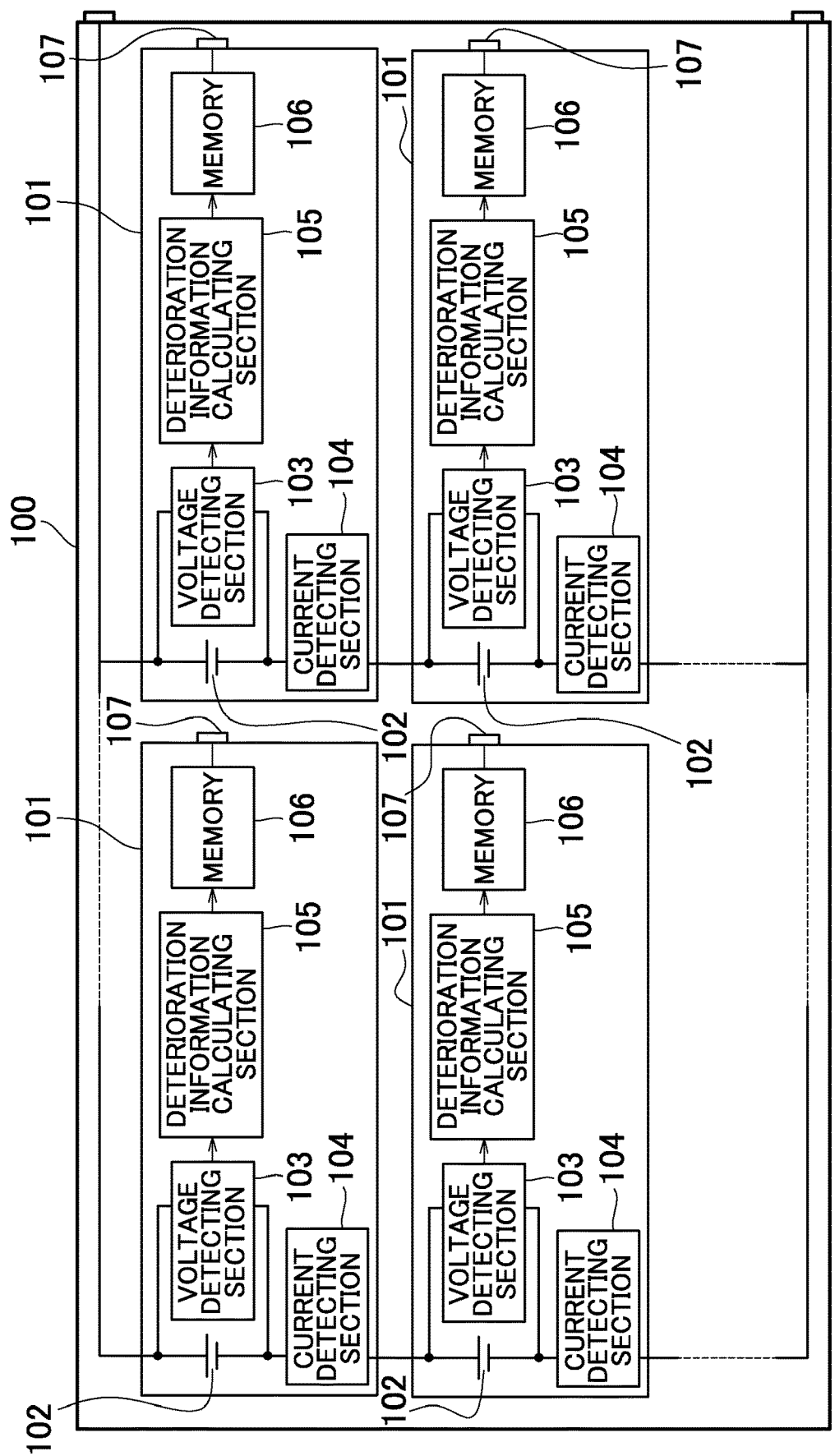
FIG. 1 shows an exemplary configuration of a battery pack 100.

FIG. 1 shows an exemplary configuration of a battery pack 100. The battery pack 100 includes a plurality of batteries 102 and a plurality of memories 106 that correspond respectively to the batteries 102 and that each record deterioration information of the corresponding battery 102. Each battery 102 may be formed integrally with the corresponding memory 106 to create a battery cell 101. Each battery 102 is formed of a pair of electrodes. The battery 102 in each battery cell 101 is formed of a pair of electrodes, each battery cell 101 includes an exterior portion that shields the pair of electrodes from the outside, and each memory 106 is provided within a corresponding exterior portion. Each battery 102 may be a two-dimensional battery, such as a lithium-ion battery.

Each memory 106 records the deterioration information of the corresponding battery 102. Each battery cell 101 of the battery pack 100 is detachably connected to another battery cell 101, and the battery pack 100 can be disassembled to remove each battery cell 101 without damaging the battery cells 101. For example, the battery cells 101 may be connected by screws, bolts, nuts, or the like. Instead, the battery cells 101 can be connected to each other in a fixed state by exerting pressure on the battery cells 101 without using bolts or nuts. For example, the battery cells 101 may be pressed against each other and connected by a retractable substance such as rubber. As another example, the battery cells 101 may be connected by being pressed by an exterior portion of the battery pack 100.

Each battery cell 101 may include a voltage detecting section 103 that detects voltage of the corresponding battery 102. Each battery cell 101 may include a current detecting section 104 that detects current of the corresponding battery 102. The voltage detecting sections 103 and the current detecting sections 104 are disposed within the exterior portions of the battery cells 101. In the present Specification, the voltage detecting sections 103 and the current detecting sections 104 can be referred to generally as "detecting sections." Each memory 106 records deterioration information of the corresponding battery 102 based on at least one of the voltage of the battery 102 and current of the battery 102 detected by the detecting sections of the corresponding battery cell 101.

Each battery cell 101 may include a deterioration information calculating section 105 that calculates the deterioration information of the corresponding battery 102 based on the information concerning at least one of the voltage and the current detected by the corresponding detecting sections. Each memory 106 records the deterioration information calculated by the corresponding deterioration information calculating section 105. Here, the deterioration information calculating section 105 "corresponding" to a memory 106 refers to the deterioration information calculating section 105 disposed in the same battery cell 101 as the memory 106. Each deterioration information calculating section 105 may be realized by an information processing device such as a CPU. In this case, each information processing device may include a recording medium in which a prescribed program is recorded, and may function as a deterioration information calculating section 105 according to this prescribed program. As another example, each deterioration information calculating section 105 may be realized by an electric circuit or an electronic circuit. Each deterioration information calculating section 105 includes a clock circuit that measures time. For ease of explanation, the following description deals with one battery cell 101, but each battery cell 101 may have the same configuration.

The memory 106 may record, as the deterioration information, at least one of the number of times the battery 102 is charged and discharged, the history of the voltage of the battery 102, the history of the current of the battery 102, the voltage of the battery 102 when charging is begun, the voltage of the battery 102 when charging is finished, the internal resistance value of the battery 102 and change thereof, a charge curve of the battery 102, and a deterioration curve of the battery 102. The number of times the battery 102 is charged and discharged is measured such that a cycle of charging and discharging is counted as 1 time. In other words, the period from when the battery 102 is charged to the next charging of the battery 102 may be counted as 1 time. The charge/discharge count can be measured according to the voltage history and the current history. The deterioration information calculating section 105 may calculate the number of charge/discharge times based on the voltage history, or based on the current history.

The voltage history indicates the change in the voltage of the battery 102 over time. In other words, the voltage history can be obtained by recording the voltage detected by the voltage detecting section 103 over each of a plurality of predetermined periods. When recording the voltage history in the memory 106 as the deterioration information, the deterioration information calculating section 105 may record a value indicating the voltage detected by the voltage detecting section 103 over each predetermined period in the memory 106 as-is. The current history indicates the change in the current of the battery 102 over time. In other words, the current history can be obtained by recording the current detected by the current detecting section 104 over each of a plurality of predetermined periods. When recording the current history in the memory 106 as the deterioration information, the deterioration information calculating section 105 may record a value indicating the current detected by the current detecting section 104 over each predetermined period in the memory 106 as-is.

The voltage of the battery 102 when charging is begun can be referred to hereinafter as "charge-start voltage." When recording the charge-start voltage in the memory 106 as the deterioration information, the deterioration information calculating section 105 records a value of the voltage detected by the voltage detecting section 103 when charging begins in the memory 106 as-is. The voltage of the battery 102 when charging is finished can be referred to hereinafter as "charge-end voltage." When recording the charge-end voltage in the memory 106 as the deterioration information, the deterioration information calculating section 105 records a value of the voltage detected by the voltage detecting section 103 when the battery 102 is fully charged or when charging ends in the memory 106 as-is.

The internal resistance value of the battery 102 can be calculated based on the current and the voltage of the battery 102. When storing the internal resistance value in the memory 106 as the deterioration information, the deterioration information calculating section 105 may calculate the internal resistance value based on the voltage detected by the voltage detecting section 103 and the current detected by the current detecting section 104, and record the result in the memory 106. Change in the internal resistance value can be obtained by calculating the internal resistance value in each of a plurality of predetermined periods and storing the results. The charge curve indicates a relationship between the voltage and the charge period during charging of the battery 102. When recording the charge curve as the deterioration information, the deterioration information calculating section 105 may calculate the charge curve based on a value indicating the voltage detected by the voltage detecting section 103 from when charging is begun to when charging is finished, and may record the result in the memory 106. As another example, the deterioration information calculating section 105 may store a value indicating the voltage detected from when charging is begun to when charging is finished in the memory 106 as-is.

The deterioration curve indicates the deterioration history of the battery 102. The deterioration curve may indicate the change of the voltage of the battery 102 when fully charged. The deterioration curve may indicate a relationship between the number of times the battery 102 is charged and the voltage of the battery 102 when fully charged. As the number of times the battery 102 is charged increases, the voltage of the battery 102 when fully charged decreases. In other words, as the deterioration progresses, the voltage of the battery 102 when fully charged decreases. When storing the deterioration curve as the deterioration information, the deterioration information calculating section 105 may record the present number of times the battery 102 has been charged and the voltage of the battery 102 when fully charged in the memory 106. The deterioration information calculating section 105 may calculate the deterioration curve based on the information concerning the voltage of the battery 102 and the number of times the battery 102 was charged recorded in the memory 106, and record the resulting deterioration curve in the memory 106. The deterioration information calculating section 105 may calculate the deterioration curve based on the deterioration curve stored in the memory 106 and the fully-charged voltage of the battery 102 detected after a new charging, and store the resulting deterioration curve. The deterioration curve may indicate change in the internal resistance of the battery 102. As the internal resistance value of the battery 102 increases, deterioration of the battery 102 progresses. The deterioration curve may indicate a relationship between the internal resistance of the battery 102 and the number of times the battery 102 is charged. As the number of times the battery 102 is charged increases, the internal resistance of the battery 102 also increases.

The memory 106 may record temperature of the battery 102 as the deterioration information. The deterioration of the battery 102 changes according to the temperature of the battery 102. In this case, the battery pack 100 includes therein a temperature sensor that detects the temperatures of the batteries 102. A temperature sensor may be provided within the exterior portion of each battery cell 101. Each temperature sensor detects the temperature of the corresponding battery 102. Here, the battery 102 "corresponding" to a temperature sensor is the battery 102 within the same battery cell 101 as the temperature sensor. As another example, a temperature sensor may be provided inside the battery pack 100 but outside of the battery cells 101.

Each battery cell 101 may include an output interface 107 for outputting the deterioration information from the memory 106 to the outside of the battery cell 101. In this way, the deterioration information stored in the memory 106 of each battery cell 101 can be read from an external apparatus.

The battery pack 100 of the present embodiment includes a plurality of groups that each include a plurality of battery cells 101 arranged serially, and these groups are arranged in parallel. However, this is merely one example, and the battery pack 100 may include battery cells 101 that are all connected serially or battery cells 101 that are all connected in parallel. If battery cells 101 are connected serially, the current flowing through each serially connected battery cell 101 is the same. Therefore, only one current detecting section 104 is required for each set of battery cells 101 connected serially. In this case, the current detecting section 104 may be provided outside the battery cells 101. As another example, the current detecting section 104 may be provided to one of the battery cells 101 connected serially and not to the other battery cells 101 in the same serial connection. In this case, the current detecting section 104 provided to one of the battery cells 101 may detect the current of the batteries 102 in the battery cells 101 not provided with a current detecting section 104.

Furthermore, a voltage detecting section 103 may be provided in one of the battery cells 101 and not in the other battery cells 101 in the same serial connection. In this case, the voltage detecting section 103 provided in one of the battery cells 101 may detect the voltage of the batteries 102 in the battery cells 101 not provided with a voltage detecting section 103. A deterioration information calculating section 105 may be provided in one of the battery cells 101 and not in the other battery cells 101 in the same serial connection. In this case, the deterioration information calculating section 105 provided in one of the battery cells 101 may calculate the deterioration information for each of the batteries 102 in the battery cells 101 not provided with a deterioration information calculating section 105. In the above description, the voltage detecting sections 103, current detecting sections 104, and deterioration information calculating sections 105 are provided within the battery cells 101, but only the memories 106 must be provided in the battery cells 101, and at least one of the voltage detecting sections 103, the current detecting sections 104, and the deterioration information calculating sections 105 may be provided outside the battery cells 101.

Figure 2:
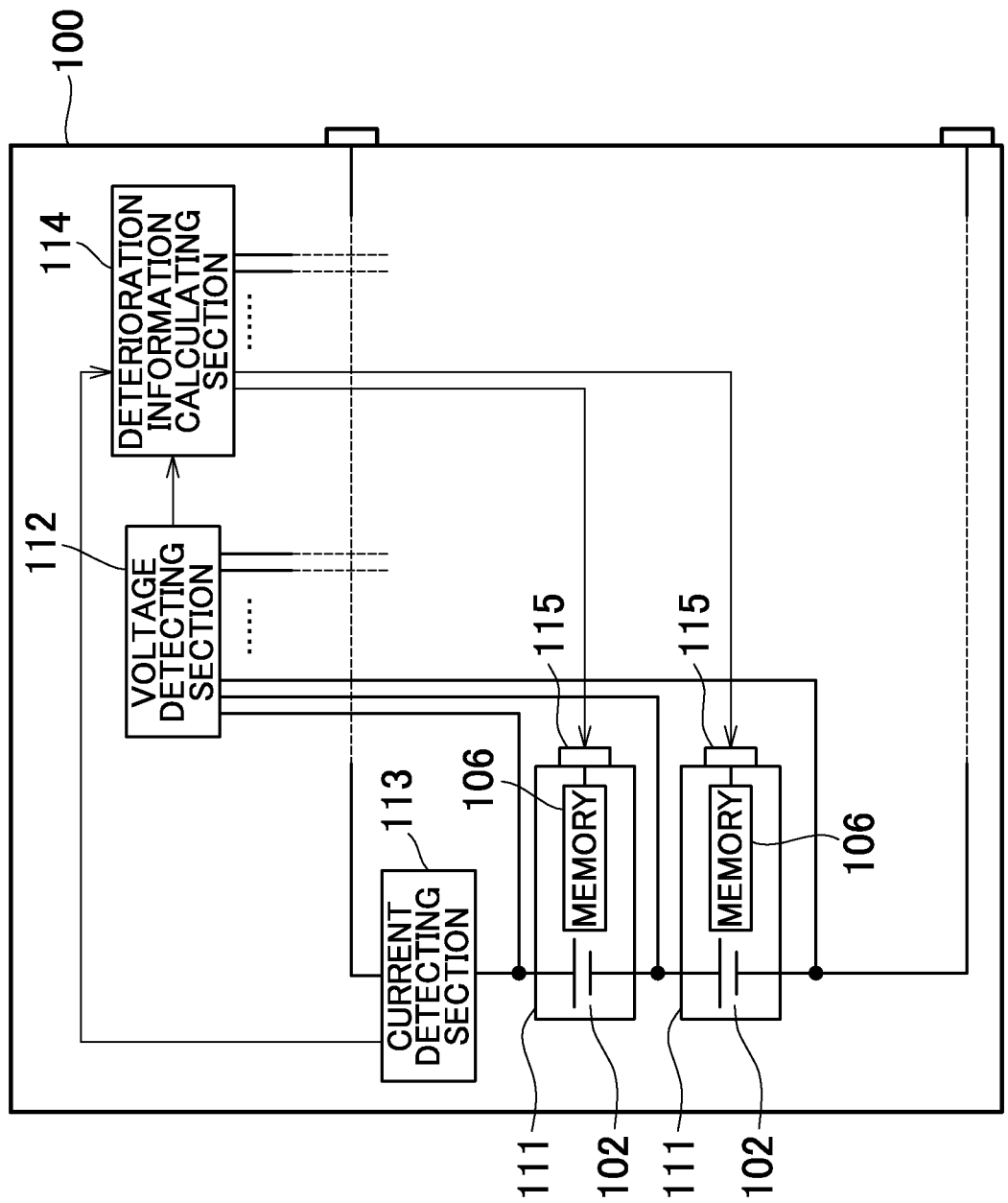
FIG. 2 shows another exemplary configuration of the battery pack 100.

FIG. 2 shows another exemplary configuration of the battery pack 100. Components that are the same as those in FIG. 1 are given the same reference numerals. The battery pack 100 includes a plurality of batteries 102 and a plurality of memories 106 that correspond respectively to the batteries 102 and record the deterioration information of the corresponding batteries 102. Each battery 102 is formed integrally with the corresponding memory 106 to create a battery cell 111. Each battery 102 is formed of a pair of electrodes. Each battery cell 111 includes a battery 102 formed of a pair of electrodes and an exterior portion that shields the pair of electrodes from the outside, and each memory 106 is provided within a corresponding exterior portion. Each memory 106 records the deterioration information of the corresponding battery 102. Each battery cell 111 of the battery pack 100 is detachably connected to another battery cell 111, and the battery pack 100 can be disassembled to remove each battery cell 111 without damaging the battery cells 111.

The battery pack 100 may include a voltage detecting section 112 that detects the voltage of each of the batteries 102. The voltage detecting section 112 is provided within the battery pack 100 and outside of the battery cells 111. The battery pack 100 may include a plurality of voltage detecting sections 112. The battery pack 100 may include a current detecting section 113 that detects the current of each of the batteries 102. The current detecting section 113 is provided within the battery pack 100 and outside of the battery cells 111. The battery pack 100 may include a plurality of current detecting sections 113. In the present Specification, the voltage detecting sections 112 and current detecting sections 113 can be referred to generally as "detecting sections." Each memory 106 records the deterioration information of the corresponding battery 102 based on at least one of the voltage and the current of the battery 102 detected by the detecting sections.

Each memory 106 may record, as the deterioration information, at least one of the number of times the battery 102 is charged and discharged, the history of the voltage of the battery 102, the history of the current of the battery 102, the voltage of the battery 102 when charging is begun, the voltage of the battery 102 when charging is finished, the internal resistance value of the battery 102 and change thereof, a charge curve of the battery 102, and a deterioration curve of the battery 102. Each memory 106 may store the temperature of the battery 102 as the deterioration information. In this case, the battery pack 100 includes therein a temperature sensor that detects the temperatures of the batteries 102. The temperature sensor may be provided within the battery pack 100 and outside the battery cells 111. As another example, the battery pack 100 may include a plurality of temperature sensors corresponding respectively to the batteries 102. In this case, each temperature sensor may be provided within the exterior portion of the corresponding battery cell 111.

The battery pack 100 may include a deterioration information calculating section 114 that calculates the deterioration information of each battery 102 based on information concerning at least one of the detected voltage and current of the battery 102. The deterioration information calculating section 114 is provided within the battery pack 100 and outside of the battery cells 111. The deterioration information calculating section 114 may be realized by an information processing device such as a CPU or by an electrical circuit or electronic circuit, in the same manner as the deterioration information calculating section 105. Each memory 106 records the deterioration information of the corresponding battery 102. The deterioration information calculating section 114 includes a clock circuit that measures time.

Each battery cell 111 may include an input/output interface 115 for receiving deterioration information being written to the memory 106 from outside the battery cell 111 and outputting the deterioration information from the memory 106 to the outside of the battery cell 111. As another example, each battery cell 111 may include an input interface for receiving deterioration information being written to the memory 106 from outside the battery cell 111 and a separate output interface for outputting the deterioration information from the memory 106 to the outside of the battery cell 111.

The deterioration information calculating section 114 records the deterioration information of the batteries 102 to the memories 106 via the input/output interfaces 115 of the battery cells 111. The deterioration information calculating section 114 records the deterioration information of each battery 102 to the memory 106 corresponding to the battery 102.

The voltage detecting section 112, the current detecting section 113, and the deterioration information calculating section 114 are described as being outside the battery cells 111, but instead, at least one of the voltage detecting section 112, the current detecting section 113, and the deterioration information calculating section 114 may be provided within one of the battery cells 111.

As described above, each memory 106 provided to a battery cell 101 records the deterioration information of the corresponding battery 102, and therefore even when the battery pack 100 is disassembled and the battery cells 101 are mixed up, it is easy to find the deterioration information for the battery 102 of each battery cell 101. In other words, even when the battery pack 100 is disassembled into individual battery cells 101, it is easy to find the deterioration information for the battery 102 of each battery cell 101.

The battery pack 100 described above can be used as a battery mounted in a vehicle. This vehicle battery may be formed of one or more battery packs 100. The following describes a power supplying system that includes a vehicle in which the vehicle battery is mounted and a power supplying apparatus that supplies power to the vehicle.

Figure 3:
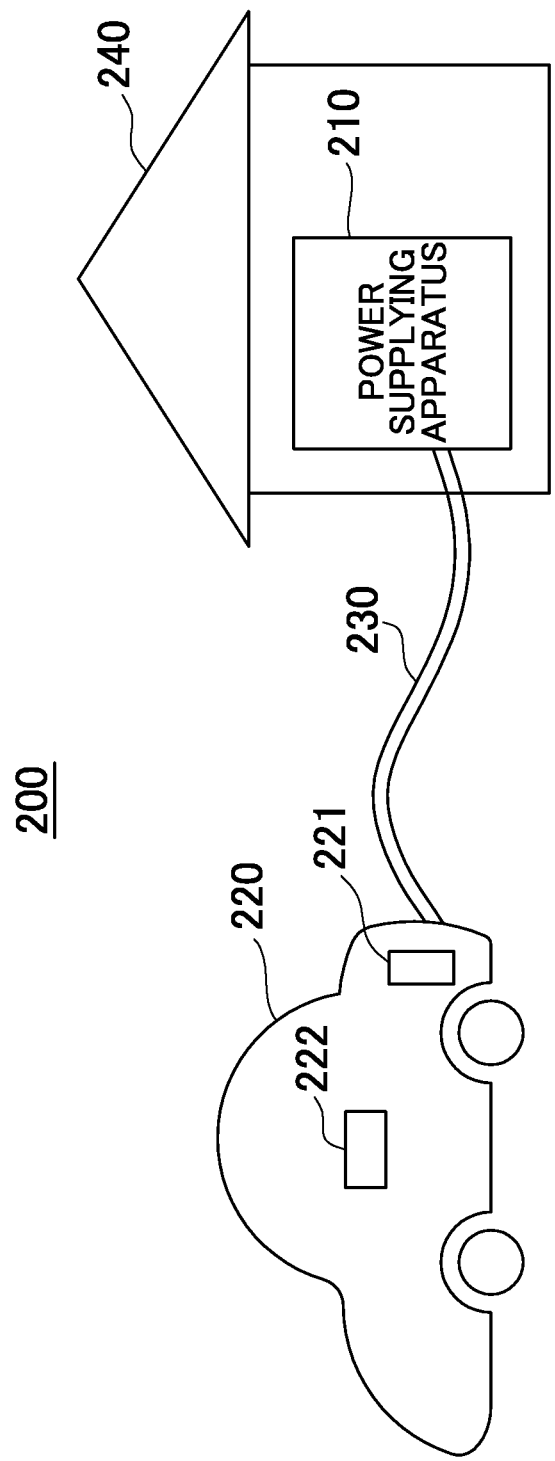
FIG. 3 shows an exemplary power supplying system 200.

FIG. 3 shows an exemplary power supplying system 200. The power supplying system 200 includes a power supplying apparatus 210, a vehicle 220, and a cable 230. The vehicle 220 includes a vehicle battery 221 and equipment 222. The vehicle 220 may be an electric vehicle or a hybrid vehicle. The vehicle 220 may be any type of vehicle in which a vehicle battery 221 is mounted. The cable 230 connects the power supplying apparatus 210 to the vehicle 220. The cable 230 conducts the power supplied by the power supplying apparatus 210 to the vehicle 220. The cable 230 may include a dedicated power line and a dedicated communication line. The dedicated power line conducts the power supplied from the power supplying apparatus 210 to the vehicle 220. The dedicated communication line transmits a control signal from the power supplying apparatus 210 to the vehicle 220. The equipment 222 adjusts the driving environment of the vehicle 220. The equipment 222 may be an air conditioner that adjusts the temperature in the vehicle 220, for example. The air conditioner adjusts the temperature within the vehicle 220 by performing at least one of heating and cooling. The equipment 222 may be a defogger that heats defogger wires provided in glass to remove mist from the glass. The equipment 222 may be a seat warmer that warms the seats of the driver or passengers.

The power supplying apparatus 210 may be provided in a building 240, such as a house or apartment. The power supplying apparatus 210 may supply the vehicle 220 with power from a power company via the cable 230. The power supplying apparatus 210 may include fuel batteries, solar batteries, or electric generators, and may supply the vehicle 220 with the power generated by these fuel batteries, solar batteries, or electric generators. The power supplying apparatus 210 may include a rechargeable battery and supply the vehicle 220 with power accumulated in the rechargeable battery. The power supplying apparatus 210 supplies power for charging the vehicle battery 221 of the vehicle 220. The power supplying apparatus 210 supplies the power to the vehicle 220 via the dedicated output line of the cable 230.

The power supplying apparatus 210 controls the equipment 222 of the vehicle 220 by transmitting a control signal via the cable 230. The power supplying apparatus 210 may control the equipment 222 according to at least one of the internal temperature and the external temperature of the vehicle 220. The power supplying apparatus 210 may control the equipment 222 based on information registered by a user for controlling the equipment 222. The power supplying apparatus 210 may control the equipment 222 based on a driving environment registered by the user. For example, the power supplying apparatus 210 may control the equipment 222 such that the internal temperature of the vehicle 220 is a temperature registered by the user. As another example, the power supplying apparatus 210 may control the equipment 222 such that the internal temperature of the vehicle 220 becomes a temperature registered by the user at a time registered by the user. The power supplying apparatus 210 may generate the control signal for controlling the equipment 222. The power supplying apparatus 210 may control the equipment 222 by transmitting the control signal thereto via the dedicated communication line of the cable 230. The cable 230 need not include the designated communication line. In this case, the power supplying apparatus 210 may control the equipment 222 by transmitting the control signal thereto via the cable 230 using power communication.

Figure 4:
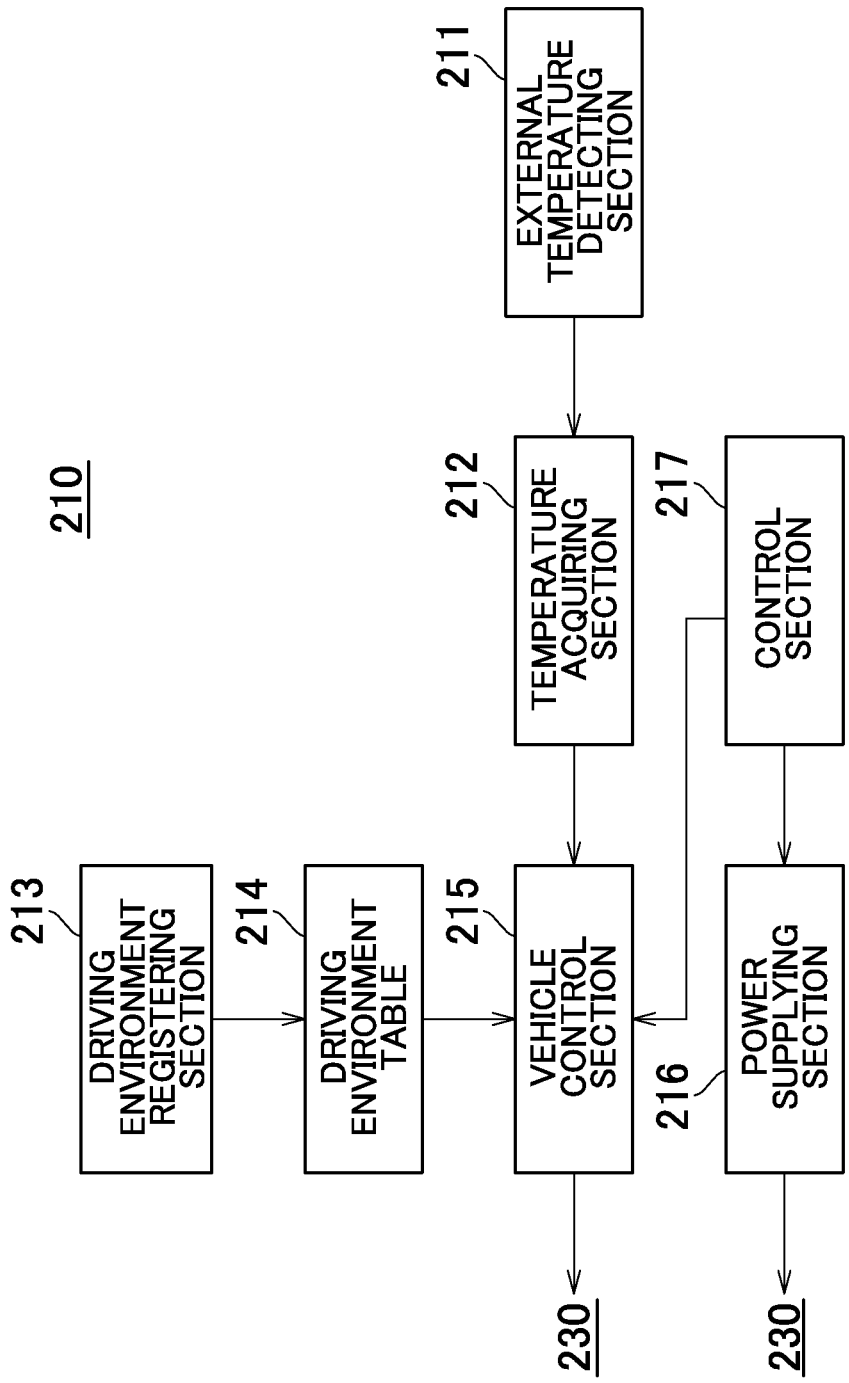
FIG. 4 shows an exemplary configuration of a power supplying apparatus 210.

FIG. 4 shows an exemplary configuration of the power supplying apparatus 210. The power supplying apparatus 210 includes an external temperature detecting section 211, a temperature acquiring section 212, a driving environment registering section 213, a driving environment table 214, a vehicle control section 215, a power supplying section 216, and a control section 217.

The external temperature detecting section 211 detects external temperature. The external temperature detecting section 211 may include a temperature sensor. The temperature acquiring section 212 acquires the external temperature detected by the external temperature detecting section 211. The temperature acquiring section 212 may acquire the temperature detected by a temperature detecting section provided to the vehicle 220. The temperature acquiring section 212 may acquire at least one of the detected external temperature and internal temperature of the vehicle 220.

The driving environment registering section 213 receives the driving environment input by the user. The driving environment registering section 213 registers the driving environment by recording information input by the user indicating the driving environment in the driving environment table 214. The vehicle control section 215 acquires the driving environment information input by the user from the driving environment table 214. The vehicle control section 215 may control the equipment 222 according to the acquired external temperature. When the temperature acquiring section 212 acquires the internal temperature of the vehicle 220, the vehicle control section 215 may control the equipment 222 according to the acquired internal temperature. The vehicle control section 215 may control the equipment 222 according to both the internal temperature and the external temperature. The vehicle control section 215 may control the equipment 222 according to the driving environment input by the user. The vehicle control section 215 may control the equipment 222 according to the driving environment and to the external temperature and/or the internal temperature. The vehicle control section 215 may generate a control signal for controlling the equipment 222. The vehicle control section 215 may control the equipment 222 by transmitting the control signal to the vehicle 220 via the cable 230.

The power supplying section 216 supplies the vehicle 220 with power from a power company via the cable 230. The power supplying section 216 supplies the vehicle 220 with the power via the dedicated power line of the cable 230. The power supplying section 216 converts the alternating current of the power company into direct current, and supplies the direct current power to the vehicle 220. The control section 217 controls each component of the power supplying apparatus 210. When a connection between the vehicle 220 and the power supplying apparatus 210 is detected, the control section 217 may control the equipment 222 using the vehicle control section 215 and supply power to the vehicle 220 using the power supplying section 216. The control section 217 may judge the vehicle 220 to be connected to the power supplying apparatus 210 when a signal is received from the vehicle 220. For example, the control section 217 may judge this connection to be established when a communication signal is sent from the control section 217 to the vehicle 220 and a response signal is sent back to the control section 217 from the vehicle 220 in response to the communication signal. The temperature acquiring section 212, the driving environment registering section 213, the driving environment table 214, the vehicle control section 215, and the control section 217 may be realized as an information processing device such as a CPU. The power supplying apparatus 210 may include a recording medium on which is recorded a prescribed program, and the information processing device may function as the power supplying apparatus 210 according to the prescribed program.

Figure 5:
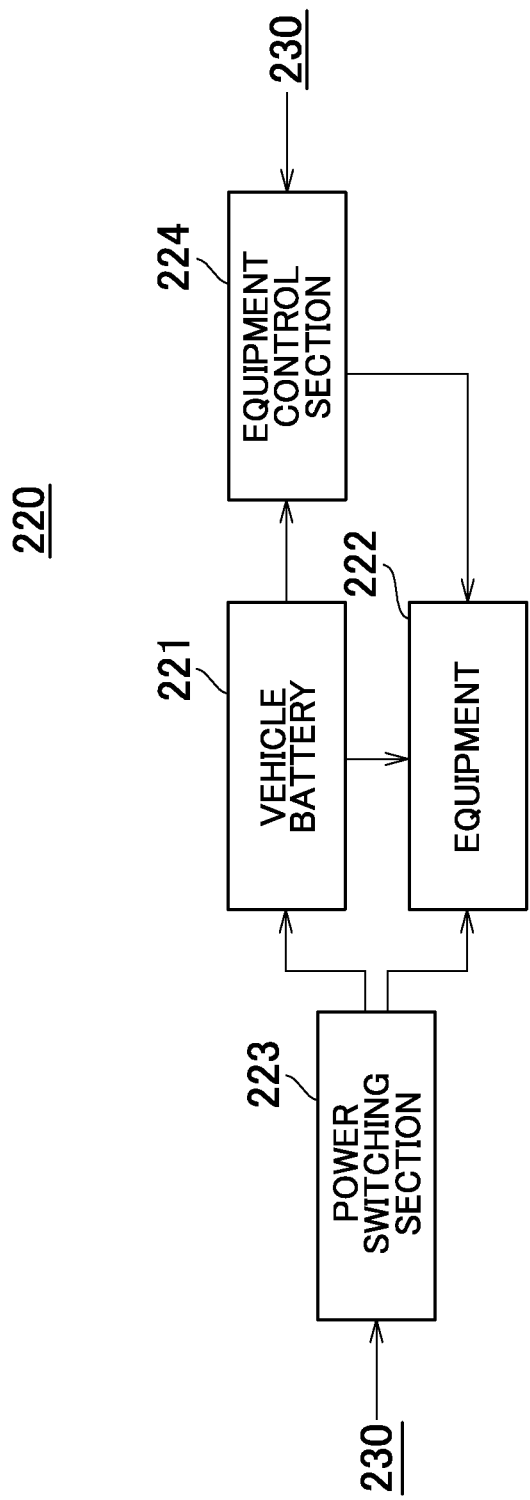
FIG. 5 shows an exemplary configuration of a vehicle 220.

FIG. 5 shows an exemplary configuration of the vehicle 220. The vehicle 220 includes the vehicle battery 221, the equipment 222, a power switching section 223, and an equipment control section 224. The vehicle battery 221 accumulates power for moving an electrical system such as the equipment 222 or a motor of the vehicle 220. The vehicle battery 221 may be a lithium ion battery, or another type of two-dimensional battery. The equipment 222 includes at least one of an air conditioner, a defogger, and a seat warmer.

The power switching section 223 switches the destination of the power supplied from the power supplying section 216 via the cable 230 to be the vehicle battery 221 or the equipment 222. The power switching section 223 supplies the power to the vehicle battery 221 until the vehicle battery 221 is fully charged. In this case, the vehicle battery 221 supplies the equipment 222 with the power accumulated therein. The power switching section 223 supplies the equipment 222 with power when the vehicle battery 221 is fully charged. In this case, the power accumulated in the vehicle battery 221 is not supplied to the equipment 222. A determination concerning whether the vehicle battery 221 is fully charged can be made based on the voltage of the vehicle battery 221, for example. The power switching section 223 may supply the vehicle battery 221 and the equipment 222 in parallel with the power transmitted via the cable 230. In other words, the power switching section 223 may supply the power simultaneously to the vehicle battery 221 and the equipment 222. The power switching section 223 may include a switch and an information processing device, and may switch the destination of the supplied power by controlling the switch with the information processing device.

The equipment control section 224 controls the equipment 222 according to the control signal transmitted from the vehicle control section 215 via the cable 230. The equipment control section 224 may control the equipment 222 by transmitting the control signal from the vehicle control section 215 to the equipment 222 as-is. As another example, the equipment control section 224 may control the equipment 222 by generating, according the control signal transmitted from the vehicle control section 215, a control signal for controlling the equipment 222. The equipment control section 224 may be realized by an information processing device. The vehicle 220 may include a recording medium on which is recorded a prescribed program, and the information processing device may be caused to function as the equipment control section 224 according to the prescribed program.

FIG. 6 shows an exemplary driving environment table 214. The time that the user uses the vehicle 220, the type of equipment 222 being controlled, and the driving environment are recorded in the driving environment table 214. IN the driving environment table 214, the usage time is recorded as "2009/2/20, 7:30," "2009/2/20, 20:00," and "2009/2/21, 13:00," for example. The content recorded for the type of equipment 222 being controlled includes the "air conditioner," the "defogger," and the "seat warmer," and adjustments according to each type of equipment 222 are recorded as the content for the driving environment. For example, for the vehicle 220 usage time of Feb. 20, 2009, at 7:30, the driving environments for the recorded types of equipment 222 respectively indicate that the air conditioner maintains an internal temperature of 25 degrees, the defogger is turned on, and the seat warmer is set to a high temperature. For the vehicle 220 usage time of Feb. 21, 2009, at 13:00, the driving environments for the recorded types of equipment 222 respectively indicate that the air conditioner maintains an internal temperature of 26 degrees, the defogger is turned off, and the seat warmer is turned off. In this way, the user can input vehicle 220 usage times and driving environments for these times, and the driving environment registering section 213 can register the information input by the user by recording this information in the driving environment table 214.

The following describes the operation of the power supplying system 200. When the control section 217 of the power supplying apparatus 210 detects that the power supplying apparatus 210 and the vehicle 220 are connected via the cable 230, the control section 217 causes the power supplying section 216 to supply power to the vehicle 220. The control section 217 need not control the power supplying section 216. In this case, the power supplying section 216 may automatically supply power to the vehicle 220 when the vehicle 220 is connected to the power supplying apparatus 210 via the cable 230. For example, the power supplying section 216 may be in a state of constantly supplying power, thereby acting in the same manner as a home electrical outlet that supplies power whenever a plug is inserted therein. The power switching section 223 of the vehicle 220 supplies the vehicle battery 221 with the power transmitted from the power supplying section 216. As a result, the vehicle battery 221 can be charged. At this time, when the equipment 222 requires power, the vehicle battery 221 may supply the needed power to the equipment 222. When the vehicle battery 221 is fully charged, the power switching section 223 switches the destination of the supplied power from the vehicle battery 221 to the equipment 222. Furthermore, when the vehicle battery 221 is fully charged and the equipment 222 does not require power, the power switching section 223 provides power to neither the vehicle battery 221 nor the equipment 222. Instead of supplying power to only one of the vehicle battery 221 and the equipment 222 at a time, the power switching section 223 may supply power to both the vehicle battery 221 and the equipment 222 in parallel.

When the control section 217 detects that the power supplying apparatus 210 and the vehicle 220 are connected via the cable 230, the control section 217 causes the vehicle control section 215 to control the equipment 222 of the vehicle 220. The vehicle control section 215 acquires the external temperature acquired by the temperature acquiring section 212. The temperature acquiring section 212 may acquire the external temperature detected by the external temperature detecting section 211. Instead, the temperature acquiring section 212 may acquire the external temperature from the vehicle 220. In this case, the vehicle 220 may include a temperature sensor that detects the external temperature. The vehicle control section 215 acquires from the driving environment table 214 information indicating the next vehicle 220 usage time and the driving environment corresponding to this usage time. The vehicle control section 215 generates the control signal for controlling the equipment 222, based on the information indicating the acquired external temperature, the usage time, and the driving environment.

More specifically, the vehicle control section 215 estimates the current internal temperature of the vehicle 220 based on the acquired external temperature. The vehicle control section 215 may include a table in which external temperature is associated with internal temperature, and may estimate the internal temperature based on this table. At a given usage time, the vehicle control section 215 controls the equipment 222 to create the driving environment corresponding to this usage time. Here, the vehicle control section 215 controls the equipment 222 according to the estimated internal temperature. For example, as shown in FIG. 6, when the acquired usage time is "2009/2/20 20:00," the registered internal temperature is "27 degrees," and so the vehicle control section 215 generates a control signal that causes the air conditioner to set the internal temperature of the vehicle 220 to 27 degrees at 8:00 p.m. on Feb. 20, 2009, and transmits this control signal to the vehicle 220. As a result, the internal temperature of the vehicle 220 can be set to the registered temperature at the corresponding usage time. The vehicle control section 215 may change the control signal for controlling the air conditioner, according to the difference between the current internal temperature and the registered internal temperature. The content of the control signal may include the start time of the air conditioning or the strength of the air conditioning by the air conditioner. When there is a long interval between the air conditioning start time and the usage time, the strength of the air conditioning may be lower than when this interval is shorter. When the difference between the current internal temperature and the registered internal temperature is smaller, the strength of the air conditioning may be lower than when this difference is larger. The strength of the air conditioning affects the speed at which the current temperature reaches the registered temperature. When the strength of the air conditioning is high, the time necessary for the current internal temperature to change to the registered internal temperature is shorter than when this strength is low.

When the acquired usage time is "2009/2/20 20:00," the defogger is turned "on," and therefore the vehicle control section 215 generates a control signal that causes the defogger to begin heating the defogger wires at a time that is a predetermined time earlier than the usage time of 8:00 p.m. on Feb. 20, 2009, and provides this control signal to the vehicle 220. As a result, mist can be removed from the glass of the vehicle 220 at the corresponding usage time. When the acquired usage time is "2009/2/20 20:00," the seat warmer is set to "medium," and therefore the vehicle control section 215 generates a control signal that causes the seat warmer to warm the seats with "medium" strength at a time that is a predetermined time earlier than the usage time, and supplies this control signal to the vehicle 220. The strength of the seat warmer indicates the temperature to which the seats are warmed. As a result, the seats of the vehicle 220 can be warmed at the corresponding usage time. In this way, the driving environment of the vehicle 220 can be adjusted from a remote location, such as inside a building, without the user needing to go out to the vehicle 220.

When the temperature acquiring section 212 acquires the internal temperature from the vehicle 220, the vehicle control section 215 generates a control signal for controlling the equipment 222 based on the current internal temperature, the usage time, and the driving environment corresponding to the usage time. In this case, it is not necessary to estimate the internal temperature of the vehicle 220. Furthermore, since the internal temperature of the vehicle 220 is detected, the vehicle control section 215 can judge whether the detected internal temperature is equal to the registered internal temperature and can accurately control the internal temperature of the vehicle 220.

The equipment control section 224 of the vehicle 220 controls the equipment 222 according to the control signal transmitted from the vehicle control section 215. The equipment control section 224 may control the equipment 222 by transmitting the control signal received from the vehicle control section 215 to the equipment 222 as-is.

Since the equipment 222 of the vehicle 220 is controlled from the power supplying apparatus 210 in the manner described above, the vehicle 220 can be controlled without the user needing to go to the vehicle 220. Furthermore, the equipment 222 is controlled according to the external temperature, and therefore the driving environment of the vehicle 220 can be adjusted to match the driving environment corresponding to the external temperature. In addition, as a result of the user registering driving environments, the driving environment of the vehicle 220 can be adjusted by the user as desired. Since the vehicle battery 221 is being charged, the driving environment can be adjusted without the driving of the equipment 222 decreasing the power of the vehicle battery 221. The equipment 222 is driven by the power from the power company when the vehicle battery 221 is fully charged, and therefore the driving environment can be adjusted without decreasing the power of the vehicle battery 221. Furthermore, lack of power for the vehicle battery 221 due to adjustment of the driving environment, which could prevent the vehicle 220 from being driven, is prevented.

The vehicle control section 215 may control the equipment 222 according to only the temperature acquired by the temperature acquiring section 212, without acquiring a driving environment from the driving environment table 214. In this case, the vehicle control section 215 may control the equipment 222 to create a predetermined driving environment. For example, when the external temperature is lower than a first temperature, the air conditioner may be powered to perform heating and the defogger and seat warmer may be turned on. When the external temperature is higher than a second temperature, the air conditioner may be powered to perform cooling and the defogger and seat warmer may be turned off. The first temperature may be less than or equal to the second temperature. The vehicle control section 215 may control the equipment 222 according to only the driving environment acquired from the driving environment table 214, without consideration to the temperature acquired by the temperature acquiring section 212. The vehicle control section 215 may control the equipment 222 by transmitting to the equipment control section 224 information indicating the driving environment acquired from the driving environment table 214. In this case, the vehicle control section 215 controls the equipment 222 according to the driving environment acquired by the equipment control section 224.

If the power supplying apparatus 210 is provided outside of the building 240, an information processing device such as a computer may be provided in the building 240 and connected to the power supplying apparatus 210. In this case, the information processing device provided in the building may be used to register the driving environment input by the user. In other words, the information processing device may function as the driving environment registering section 213 and the driving environment table 214. Furthermore, the information processing device provided in the building 240 may generate the control signal for controlling the equipment 222 and transmit the control signal to the power supplying apparatus 210. In this case, the vehicle control section 215 of the power supplying apparatus 210 controls the equipment 222 by transmitting the control signal received from the information processing device to the vehicle 220 via the cable 230.

In the above description, the power supplying apparatus 210 is connected to the vehicle 220 via the cable 230 and the power supplying apparatus 210 supplies power and transmits the control signal to the vehicle 220 via the cable 230. Instead, the power supplying apparatus 210 may supply power and transmit the control signal to the vehicle 220 without using the cable 230. For example, the power supplying apparatus 210 may supply the vehicle 220 with power using microwave power transmission. The power supplying apparatus 210 may transmit the control signal to the vehicle 220 using microwave communication.

The battery pack used as the vehicle battery 221 if the vehicle 220 in the above description can be recycled and disassembled into individual battery cells. The battery cells can then be repacked and used again. The following describes a battery assembling apparatus used for repacking battery cells.

Figure 7:
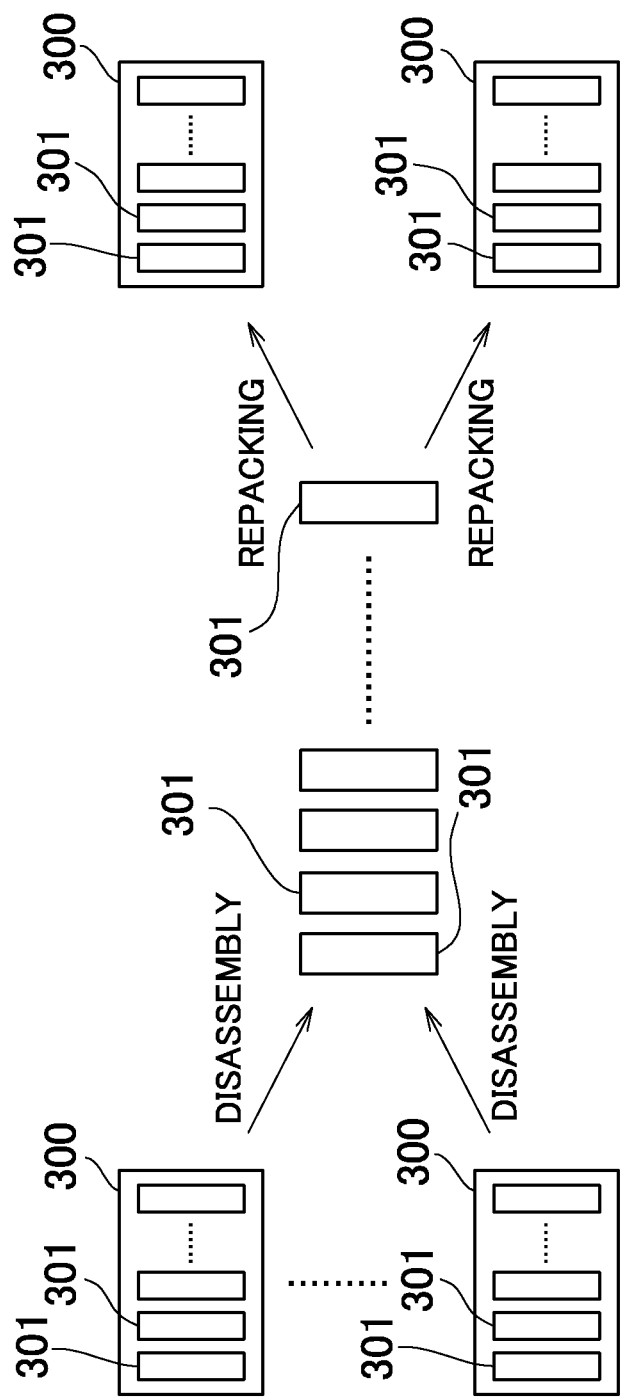
FIG. 7 shows an overview of repacking battery cells.

FIG. 7 shows an overview of repacking battery cells. Here, a plurality of used battery packs 300 are each disassembled into individual battery cells 301. In other words, the battery packs 300 are disassembled and the battery cells 301 are mixed up. A group of battery cells 301 having similar charge curves are selected from among the randomly mixed battery cells 301 to be assembled into one battery pack. The group of selected battery cells 301 is assembled as a single battery pack to form a battery pack 300. The battery cells 301 may be the same as the battery cells 101 shown in FIG. 1 or the battery cells 111 shown in FIG. 2. The battery cell 301 need not include memories 106.

Figure 8:
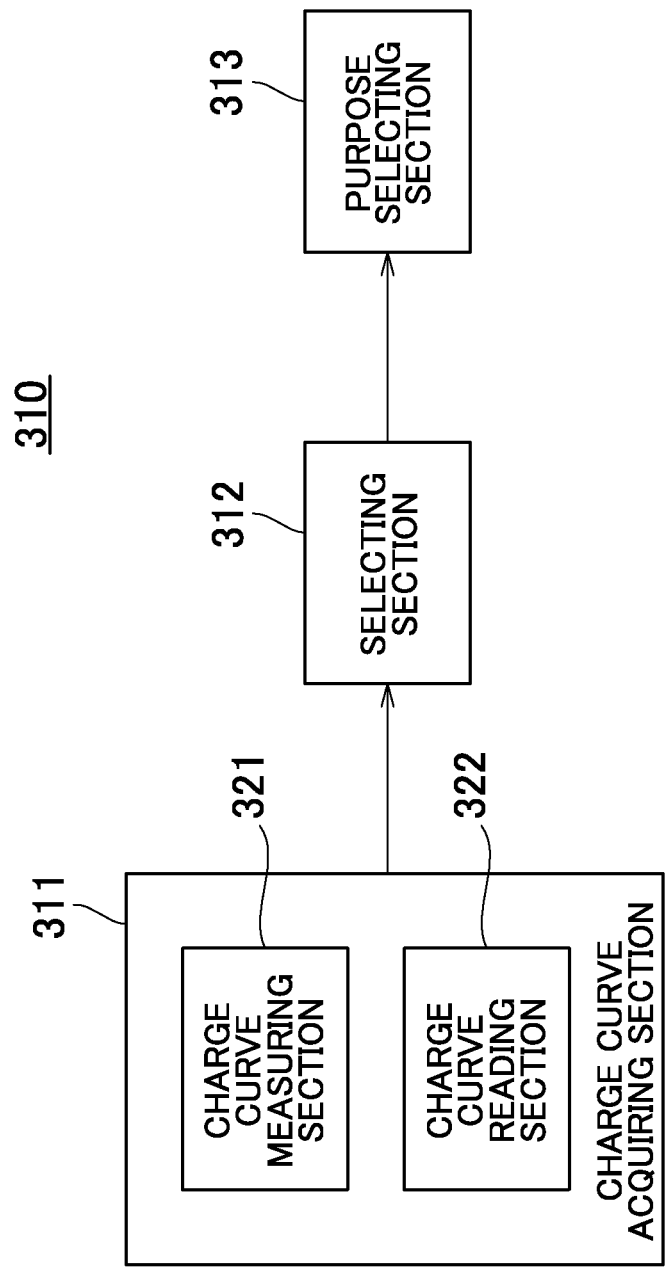
FIG. 8 shows an exemplary configuration of a battery assembling apparatus 310.

FIG. 8 shows an exemplary configuration of a battery assembling apparatus 310. The battery assembling apparatus 310 includes a charge curve acquiring section 311, a selecting section 312, and a purpose selecting section 313. The charge curve acquiring section 311 acquires the charge curve of each of a plurality of battery cells 301. The charge curve acquiring section 311 includes a charge curve measuring section 321 and a charge curve reading section 322. An information processing device may function as the battery assembling apparatus 310 by reading a prescribed program. The information processing device may include a recording medium on which the prescribed program is recorded.

The charge curve measuring section 321 charges and discharges the battery cells 301, and measures the charge curve of each battery cell 301. In this way, the charge curve of each battery cell 301 can be obtained. Each charge curve indicates a relationship between the voltage and the charge period, which is the time necessary for the battery cell 301 to be charged from a first voltage to a second voltage that is higher than the first voltage. The charge curve measuring section 321 discharges each battery cell 301 to the first voltage, and then charges the battery cell 301. The charge curve measuring section 321 can measure each charge curve by measuring the charge period necessary for the voltage of the corresponding battery cell 301 to change from the first voltage to the second voltage and measuring the voltage at each point in time during the charge period. The charge curve measuring section 321 includes a control section that controls the charging and discharging of the battery cells 301. The control section may be realized by an information processing device. The charge curve measuring section 321 may supply the battery cells 301 with power from the power company. The charge curve measuring section 321 may supply the battery cells 301 with power generated by fuel batteries, solar batteries, or electric generators provided thereto. The second voltage may be the voltage reached when a battery cell 301 is fully charged.

The charge curve reading section 322 reads information indicating the charge curve of each battery cell 301, from the memories provided respectively to the battery cells 301. If the battery cells 301 are the same as the battery cells 101 shown in FIG. 1, the charge curve reading section 322 reads the information indicating the charge curves recorded in the memories 106 via the output interfaces 107. If the battery cells 301 are the same as the battery cells 111 shown in FIG. 2, the charge curve reading section 322 reads the information indicating the charge curves recorded in the memories 106 via the input/output interfaces 115. The information indicating each charge curve may be information displaying the charge curve itself, or may be information allowing the charge curve to be understood. For example, each charge curve may be the voltage history of the corresponding battery cell 301. In his case, the charge curve reading section 322 may read the voltage history of a battery cell 301 from the corresponding memory 106 and calculate the corresponding charge curve based on this voltage history. The information indicating each charge curve may be information indicating the voltage history and the change of the internal resistance value of the corresponding battery 102. In this case, the charge curve reading section 322 may read the voltage history and the change of the internal resistance value from the corresponding memory 106 and calculate the charge curve based on this voltage history and change of the internal resistance value. The charge curve reading section 322 may be realized by an information processing device such as a CPU, or by an electrical circuit or an electronic circuit.

For a battery cell 301 that does not include a memory in which information indicating the charge curve is recorded, the charge curve thereof is preferably measured by the charge curve measuring section 321. For a battery cell 301 that does include a memory in which information indicating the charge curve is recorded, the charge curve thereof is preferably read by the charge curve reading section 322. Even for a battery cell 301 that does not include a memory, if there is a recording medium in which is recorded information indicating the charge curve of this battery cell 301, the charge curve reading section 322 may read the information indicating the charge curve from the recording medium. The charge curve acquiring section 311 may judge whether each battery cell 301 includes a memory 106 in which is recorded information indicating the charge curve, and determine whether the charge curve measuring section 321 or the charge curve reading section 322 acquires the charge curve based on this judgment.

The selecting section 312 selects, as the battery cells to be assembled into one battery pack, battery cells 301 having similar charge curves acquired by the charge curve acquiring section 311 from among the plurality of battery cells 301. If the number of battery cells 301 having similar charge curves is less than the number of battery cells to be assembled as a battery pack, the selecting section 312 need not select battery cells to be assembled as a battery pack. If the number of battery cells 301 having similar charge curves is greater than the number of battery cells to be assembled as a battery pack, the selecting section 312 may select only the number of battery cells needed to assemble the one battery pack.

Battery cells 301 having similar charge curves refer to battery cells 301 for which the path of the charge curve is within a predetermined range. The selecting section 312 may judge battery cells 301 having similar charge periods as being the battery cells 301 having similar charge curves. The selecting section 312 may then select, as the battery cells to be assembled as one battery pack, the battery cells 301 judged to have similar charge curves. Battery cells 301 having similar charge periods may refer to battery cells 301 with matching charge periods. Battery cells 301 having similar charge periods may refer to battery cells 301 whose charge periods have a difference therebetween that is within a predetermined time range. In other words, among the battery cells selected as the battery cell 301 having similar charge periods, the battery cell 301 with the shortest charge period and the battery cell 301 having the longest charge period have a charge period difference therebetween that is within a predetermined time range.

The selecting section 312 may judge battery cells 301 having similar charge periods and similar voltages at each point in time within their charge periods to be battery cells 301 having similar charge curves. The selecting section 312 may then select, as the battery cells to be assembled as one battery pack, the battery cells 301 judged to have similar charge curves. Battery cells 301 having similar voltages at each point in time within their charge periods may refer to battery cells 301 having matching voltages at each point in time. Battery cells 301 having similar voltages at each point in time within their charge periods may refer to battery cells 301 having voltages at each point in time that are within a prescribed voltage range of each other.

The purpose selecting section 313 selects a usage purpose of the battery pack 300, according to the charge curves of the battery cell 301 selected as the battery cells 301 to be assemble as the battery pack 300. The purpose selecting section 313 may include a table that associates charge curves with usage purposes, and may select the usage purpose based on this table. The usage purpose refers to how the battery pack 300 is to be used, and may include using the battery pack 300 as an emergency power source, a power source for an electric vehicle, or a power source for a personal computer, for example.

Figure 9:
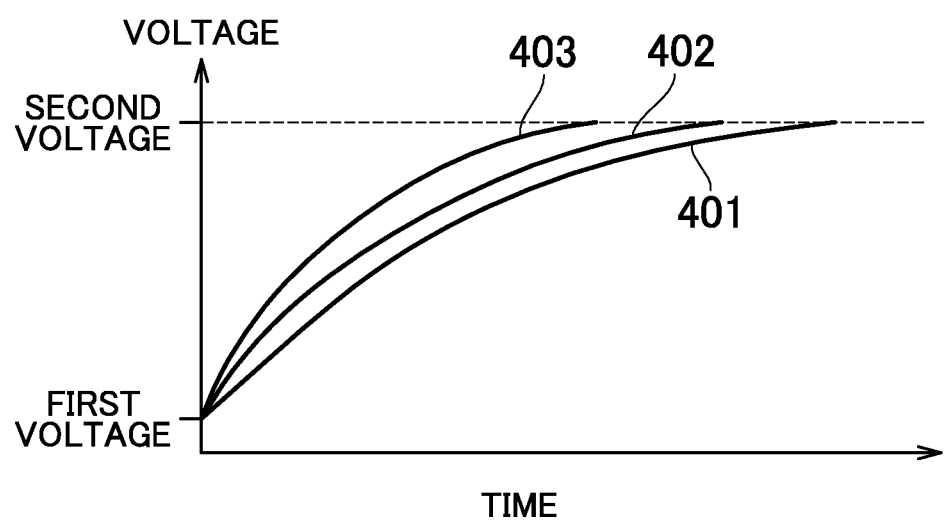
FIG. 9 shows exemplary charge curves of three battery cells 301 having different charge curves.

FIG. 9 shows exemplary charge curves of three battery cells 301 having different charge curves. The charge curve 401 represents the charge curve of a first battery cell 301. The charge curve 402 represents the charge curve of a second battery cell 301. The charge curve 403 represents the charge curve of a third battery cell 301. Based on these charge curves, it is seen that the first battery cell 301 has the longest charge period and the second battery cell 301 has the second longest charge period. Furthermore, the third battery cell 301 has the shortest charge period. Since the charge periods of the battery cells 301 differ in this way, if these battery cells 301 are assembled as one battery pack, the battery cells 301 and the overall battery pack 300 will quickly deteriorate. In other words, when charging is performed based on the battery cell 301 with the longest charge period, the battery cells 301 with shorter charge periods are over-charged, and this causes the deterioration to progress. When charging is performed based on the battery cell 301 with the shortest charge period, the battery cells 301 with longer charge periods end up with lower voltages.

In order to extend the lifetime of the battery cells 301 and the battery pack 300, the selecting section 312 may judge battery cells 301 having similar charge periods as battery cells 301 having similar charge curves. The selecting section 312 may then select, as the battery cells to be assembled as a single battery pack, the battery cells 301 having similar charge periods. By assembling the battery pack 300 using the battery cells 301 that are selected as the battery cells for assembling a single battery pack, the lifetime of the battery cells 301 and the battery pack 300 can be extended.

Figure 10:
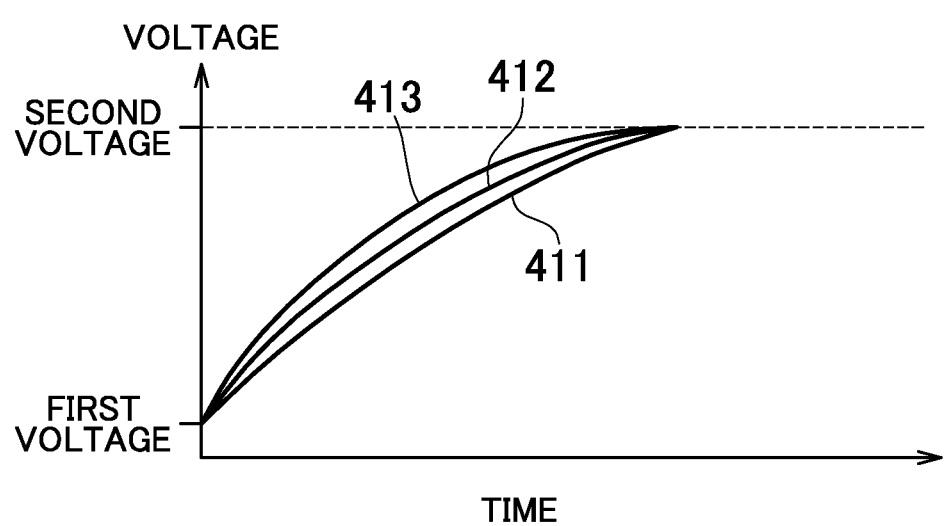
FIG. 10 shows other exemplary charge curves of three battery cells 301 having different charge curves.

FIG. 10 shows other exemplary charge curves of three battery cells 301 having different charge curves. The charge curve 411 represents the charge curve of a first battery cell 301. The charge curve 412 represents the charge curve of a second battery cell 301. The charge curve 413 represents the charge curve of a third battery cell 301. Based on these charge curves, it is seen that the first, second, and third battery cells 301 have similar charge periods. However, even though the charge periods are similar, the voltages of the battery cells at each point in time during their charge periods are different, and therefore if these battery cells 301 are assembled as one battery pack, deterioration of the battery cells 301 and the overall battery pack 300 will progress.

Accordingly, the selecting section 312 may judge battery cells 301 having similar charge periods and similar voltages at each point in time within their charge periods to be battery cells 301 having similar charge curves. The selecting section 312 may then select, as the battery cells to be assembled as one battery pack, the battery cells 301 judged to have similar charge curves. By assembling the battery pack 300 using the battery cells 301 selected as the battery cells to be assembled as the one battery pack, the lifetime of the battery cells 301 and the battery pack 300 can be extended.

In the above description, battery cells 301 that have been used once are repacked, but the repacking method described above can be used for new battery cells 301 that have yet to be used. Even new battery cells 301 can have different charge curves. Accordingly, the selecting section 312 may select, as the battery cells to be assembled as one battery pack, new battery cells 301 that have similar charge curves from among a plurality of new battery cells 301.

In the above description, the charge curves of the battery cells 301 are acquired, but instead, the selecting section 312 may select, as the battery cells to be assembled as the one battery pack, battery cells currently having similar degrees of deterioration. The current degree of deterioration may be the current internal resistance value of the battery cell 301 or the current voltage of the battery cell 301 when fully charged. As another example, the battery assembling apparatus 310 may acquire the deterioration curves of the battery cells 301. The battery assembling apparatus 310 may include a deterioration curve acquiring section that acquires the deterioration curve of each battery cell 301. The deterioration curve acquiring section may acquire the deterioration curve of each battery cell 301 by acquiring information indicating the deterioration curve from each memory in a corresponding battery cell 301. The selecting section 312 may select, as the battery cells 301 to be assembled as one battery pack 300, battery cells 301 that have similar deterioration curves and similar current degrees of deterioration, from among a plurality of battery cells 301.

Each deterioration curve may indicate the gradual change of the fully charged voltage of a battery cell 301. In this case, battery cells 301 having similar deterioration curves may be battery cells 301 having fully charged voltage changes that are within a predetermined range. As another example, each deterioration curve may indicate change of the internal resistance value of a battery cell 301. In this case, the battery cells 301 having similar deterioration curves may be battery cells 301 having internal resistance value changes that are within a predetermined range. The purpose selecting section 313 may select the usage purpose of the battery pack 300 according to the deterioration curves of the battery cells 301 selected as the battery cells 301 to be assembled as the battery pack 300. Since these deterioration curves indicate change in the deterioration of the battery cells 301, the future degree of deterioration of the battery cells 301 can be roughly estimated based on the deterioration curves. Accordingly, the battery cells 301 having similar deterioration curves can be judged as battery cells 301 having similar future degrees of deterioration and deterioration rates. By assembling the one battery pack 300 using battery cells 301 having similar deterioration curves, the lifetime of the battery cells 301 and the battery pack 300 can be extended.

The following describes how the battery pack 300 repacking method can be applied. Each battery cell 301 of the battery pack 300 has a different degree of deterioration depending on where the battery cell 301 is arranged in the battery pack 300. For example, if the battery cells 301 are sensitive to heat, battery cells 301 arranged near the center of the battery pack 300 are exposed to more heat than battery cells 301 at the edges of the battery pack 300, and therefore deteriorate more quickly. In other words, battery cells 301 that are surrounded by other battery cells 301 deteriorate more quickly than battery cells 301 that are not surrounded by other battery cells 301. Accordingly, the deterioration rate of each battery cell 301 at each arrangement position can be obtained from the deterioration information of each battery cell 301, and the repacking can be performed while arranging the battery cells 301 at suitable positions. For example, the battery cell 301 arranged at the position having the lowest deterioration rate can be repacked at a position having the highest deterioration rate, and the battery cell 301 arranged at the position having the highest deterioration rate can be repacked at a position having the lowest deterioration rate. In this way, the deterioration rate of each battery cell 301 in the battery pack 300 can be made uniform. This repacking may be performed periodically at predetermined intervals. The deterioration information of each battery cell 301 may be read from the corresponding memory if the battery cell 301 includes a memory therein. For a battery cell 301 that does not include a memory, the corresponding deterioration information may be measured. This process involves an information processing device such as a CPU calculating the deterioration rate at the position where each battery cell 301 is arranged, based on the deterioration information of the battery cells 301. The information processing device may then calculate the position at which each battery cell 301 is to be arranged, based on the deterioration information of the battery cells 301 and the deterioration rate at each arrangement position.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

What is claimed is:
1. A battery assembling apparatus comprising:
a controller programmed to assemble a battery including a sub-plurality of a plurality of prior-used battery cells into a battery pack assembly, the battery pack comprising:
a sub-plurality of a plurality of prior-used battery cells, each of the sub-plurality of the priority of prior-used battery cells being detachably connected to another of the sub-plurality of the plurality of prior-used battery cells such that the sub-plurality of the plurality of prior-used battery cells form an electric circuit while assembled and can be disassembled without damaging the sub-plurality of the plurality of prior-used battery cells, wherein each of the plurality of prior-used battery cells comprises:
a battery;
a current detecting circuit that detects a current of the battery;
a voltage detecting circuit that detects a voltage of the battery;
a temperature sensor that detects a temperature of the battery; and
an output interface for outputting the deterioration curve information recording a change in temperature of the battery to outside of the battery cell; and
a memory storing a deterioration curve information recording a change in temperature of the battery of each of the plurality of prior-used battery cells and at least one of a rate of change of the current of the battery, and a rate of change of the voltage of the battery, at a plurality of voltage levels of the battery during charging of the battery from a discharged state to a fully charged state;

wherein the controller is adapted to interface with the memory, and wherein the controller is programmed to cause the battery assembling apparatus to assemble the sub-plurality of the plurality of prior-used battery cells within the battery pack assembly in an order from a first one of the sub-plurality of the plurality of prior-used battery cells having a smallest change in temperature of the corresponding battery to a last one of the sub-plurality of the plurality of prior-used battery cells having a largest change in temperature of the corresponding battery, and a remainder of the plurality of prior-used battery cells having a change in temperature of the respective corresponding battery that is either smaller than the smallest change or larger than the largest change, wherein a remainder of the plurality of prior-used battery cells each have at least one of a smaller or higher rate of change of the current of the corresponding battery at the plurality of voltage levels of the corresponding battery than each of the sub-plurality of the plurality of prior-used battery cells, and a smaller or higher rate of the voltage of the battery at the plurality of voltage levels of the corresponding battery than each of the sub-plurality of the plurality prior-used battery cells, at the plurality of voltage levels of the corresponding battery between the discharged state and the fully charged state, and wherein the controller is further programmed to designate a usage purpose of the newly assembled battery pack based on respective deterioration curve information stored in the memory corresponding to the sub-plurality of the plurality of prior-used battery cells in the newly assembled battery pack and a table that associates the respective deterioration curve information with respective designated usage purposes.

2. The battery assembling apparatus according to claim 1, wherein the controller reads and compares the rate of change of the voltage at the plurality of voltage levels of the battery, and a rate of the change in the temperature of the battery, and arranges within the battery pack assembly at least two of the plurality of battery cells having respective charge curves each having rates of change in temperature all within a first predetermined range stored in the respective memory, for location in a central position within the battery pack; at least one of remaining ones of the plurality of battery cells having a charge curve stored in the memory including the rate of change in temperature at the plurality of voltage levels of the battery all within a second predetermined range different from the first predetermined range, for location at a first end of the battery pack; and at least one of remaining ones of the plurality of battery cells having a charge curve stored in the memory including the rate of change in temperature at the plurality of voltage levels of the battery all within the second predetermined range, for location at a second end of the battery pack, the first predetermined range and the second predetermined range relating to a maximum difference in rate of change in temperature for each of the plurality of voltage levels between the discharged state and the fully charged state.

3. The battery assembling apparatus according to claim 1, wherein each battery includes a pair of electrodes, each of the plurality of prior-used battery cells further comprises an exterior portion that shields the respective pair of electrodes from outside.

4. The battery assembling apparatus according to claim 1, wherein the battery pack assembly is installed in a vehicle.

5. The battery assembling apparatus according to claim 1, wherein the controller is further programmed to calculate an internal resistance value of the battery in each of the plurality of prior-used battery cells based on the current of the battery detected by the current detecting circuit and the voltage of the battery detected by the voltage detecting circuit.

6. The battery assembling apparatus according to claim 5, wherein the controller is further programmed to calculate a deterioration curve for each of the plurality of prior-used battery cells based on a change in the temperature of the respective battery.

7. The battery assembling apparatus as recited in claim 1, wherein the second predetermined range is larger than the first predetermined range.

* * * * *